United States Patent [19]
Thiebaud et al.

[11] Patent Number: 5,227,202
[45] Date of Patent: Jul. 13, 1993

[54] METHOD FOR CHEMICAL COATING ON OPPOSITE SURFACES OF WORKPIECES

[75] Inventors: Francis Thiebaud, Oberschan; Heinrich Zimmermann, Buchs, both of Switzerland

[73] Assignee: Balzers Aktiengesellschaft, Furstentum, Liechtenstein

[21] Appl. No.: 921,442

[22] Filed: Jul. 27, 1992

Related U.S. Application Data

[63] Continuation of Ser. No. 576,659, Aug. 31, 1990, abandoned.

[30] Foreign Application Priority Data

Sep. 22, 1989 [DE] Fed. Rep. of Germany ....... 3931713

[51] Int. Cl.⁵ .............................................. B05D 3/06
[52] U.S. Cl. ...................................... 427/488; 427/162; 427/294; 427/509; 427/522; 427/562; 427/569; 427/587; 427/591; 427/598
[58] Field of Search ................. 427/38, 39, 488, 162, 427/294, 509, 522, 562, 569, 587, 591, 598

[56] References Cited

U.S. PATENT DOCUMENTS 4,289,598  9/1981  Engle ........................ 204/192 E
4,512,284  4/1985  Robinson et al. ............... 118/723
4,971,667  11/1990  Yamazaki et al. ............... 427/39

FOREIGN PATENT DOCUMENTS

WO87/01738  3/1987  PCT Int'l Appl. .
2178062  6/1986  United Kingdom .

OTHER PUBLICATIONS

T. Wydeven, et al., "Antireflection coating prepared by plasma polymerization of perfluorobutene-2", *Appliec Optics*, vol. 15, No. 1, Jan. 1976.

E. Ritter, "Optical film materials and their applications", *Applied Optics*, vol. 15, No. 10, Oct. 1976.

*Primary Examiner*—Bernard Pianalto
*Attorney, Agent, or Firm*—Notaro & Michalos

[57] ABSTRACT

In a plasma-enhanced chemical vapor deposition method, in order to achieve greater space for positioning workpieces to be coated simultaneously and essentially identically on all sides, the workpiece are positioned at a distance from one electrode on the basis of a coating rate gradient.

11 Claims, 3 Drawing Sheets

METHOD FOR CHEMICAL COATING ON OPPOSITE SURFACES OF WORKPIECES

This application is a continuation of application Ser. No. 07/576,659, filed Aug. 31, 1990, abandoned.

FIELD AND BACKGROUND OF THE INVENTION

The present invention relates to a method for essentially identical plasma-enhanced chemical coating of opposing surface areas of a workpiece, an apparatus or facility for carrying out the method as well as applications of the method or the facility.

Plasma-enhanced vapor deposition methods are known as are facilities used for this purpose. In this connection reference is made to "Plasma deposition of inorganic thin films", Alan R. Reinberg, *Ann. Rev. Mater. Sci.* 1979, pages 341–372.

To generate a plasma it is also known to generate an electric field between two electrodes, for supplying the required energy to a gas mixture in a vacuum chamber, for the formation of the plasma. The space between the electrodes can basically be divided into two dark regions immediately in the vicinity of the electrodes with the plasma region located between the dark regions. While in the plasma region a high density of electric charge carriers is present, the space charge density resulting from the charge balance per unit volume is zero, the dark regions have a definite space charge density.

Due to the non-vanishing charge balance in the dark regions the plasma space assumes the plasma potential. Within the plasma region the potential is essentially constant. To the specialist the plasma region is a clearly defined space in connection with which reference is made for example to "Glow Discharge Processes", Brian Chapman, John Wiley & Sons (1980), pages 77–80.

In coating workpieces with the above cited method which is called PECVD (plasma-enhanced chemical vapor deposition), it is customary to dispose the workpiece on one of the electrodes. For coating with conducting layers the electrodes are operated with dc or ac voltage while for coating with insulating materials an ac voltage is provided.

A PECVD method with appropriate configuration is known from U.S. Pat. No. 3,847,652 for fabricating osmosis membranes. The plasma streams from one side against a carrier on which the membrane is to be coated while a monomer gas is supplied from the opposite side. The plasma generation takes place by means of high frequency energy on an electrode pair at a distance from the carrier. U.S. Pat. No. 3,847,652 is incorporated here by reference.

The coating of the membrane is formed specifically on one side of the carrier plate and an explanation is provided on which surface is better suited for the coating, given different surface formations of the carrier.

Furthermore it is known from German Patent DE P 33 21 906 to coat metallic powder with a synthetic film through plasma-enhanced chemical vapor deposition by stirring the powder in a rotating vacuum container between electrodes for the generation of the plasma, whereby the powder is coated on all sides.

As has been stated it is customary in plasma-enhanced chemical vapor deposition to position workpieces to be coated, which in contrast to powder cannot be stirred in the process chamber, on one of the electrodes. The disadvantage is that the workpieces are coated only from one side and that consequently subsequent turning is necessary if they are to be coated on both sides. Moreover, identical or uniform coating of workpieces of different height or of workpieces with arched surfaces is difficult as will be shown later. Three dimensional coating known according to German Patent DE P 33 21 906 for granules in which the granules are stirred back and forth due to the rotary movement of the reaction vessel in the plasma region and the dark regions, is clearly not possible for coating workpieces such as lenses, filter glasses etc.

From U.S. Pat. No. 4,361,595 it is known to generate a dc or ac discharge between two electrodes in a gas vacuum chamber. To form an abrasive layer of $SiO_x$ on synthetic disks by means of a PECVD method, in one implementation two synthetic disks to be coated are placed one on top of the other and introduced into the discharge space formed between the electrodes. U.S. Pat. No. 4,361,595 is incorporated here by reference.

It is known that only minimal requirements are made, if any at all, on the identity of abrasive layers on surfaces of different disks.

SUMMARY OF THE INVENTION

The present invention comprises a method and apparatus of the above stated type by means of which it is possible to coat workpiece surfaces which are opposing each other rationally and essentially identically.

Accordingly, one object of the present invention is to provide a method for an essentially identical plasma-enhanced chemical coating of opposite surface areas of a workpiece, comprising positioning the workpiece in a vacuum treatment chamber and in a discharge space between two electrodes in the chamber; applying an electrical potential between the electrodes for generating a plasma discharge in the discharge space; allowing the workpiece to be at a free floating electrical potential with respect to the electrodes; and establishing conditions in the treatment chamber for a plasma-enhanced simultaneous chemical vapor deposition on the opposite surface areas of the workpiece for essentially identically and simultaneously coating the opposite surface areas of the workpiece.

The invention builds on the finding, which is known per se, that in the spatial regions adjoining the electrodes, that is the dark regions, the highest deposition rate is observed if in one of these regions the workpiece to be coated is positioned directly on the electrode, but that in these regions adjoining the electrodes the deposition gradient as a function of increasing distance from the electrode under consideration is great which leads precisely to the stated problems.

It is known that the deposition rate gradient as a function of distance from the electrode becomes at least approximately zero in the plasma region, i.e. that in the plasma region the deposition rate, even if to a lesser degree than in the dark region, is largely independent of distance by which in conventional processes of this type the stated problems can be solved rather simply if one gets away from the initially obvious criterion of wanting to utilize the highest deposition rate, in the dark regions, for reasons of seemingly optimum process economy.

Thus, by turning away from a "straight forward" and obvious optimization—that is for a greatest possible coating per unit time—further extremely advantageous possibilities open up according to the present invention.

But the finding according to the invention also basically permits utilization of the plasma region for the disposition of workpieces which are spatially staggered. In this way, and significantly, more workpieces can be worked simultaneously than if their disposition is limited to the available two dimensional area of one of the electrodes.

Although it is physically entirely possible to carry out PECVD methods by means of a dc voltage discharge this is problematic when coating with insulating materials for reasons of electrode coating and the formation of capacitances through layers developing as dielectrics.

However, the method according to the invention is not limited to coating processes for insulating materials but rather can also be employed for coating with conducting materials where, as mentioned, it is possible to work with a dc voltage discharge.

However this is preferably carried out with high frequencies up into the microwave range, in particular if the coating takes place with an insulating material.

Even though it is in some cases indicated to move the areas during the coating it is also an essential element of the present invention that the areas can be kept stationary during the process and yet be coated nevertheless essentially identically and simultaneously.

It is likewise known that characteristics of the plasma region, its extend being primarily of interest here, can be influenced by applying a magnetic induction field B in the reaction space. Reference is made in this connection for example to the article "Magnetic field effects in the plasma-enhanced chemical vapor deposition of boron nitride" by T. H. Yuzuriha et al., *J. Vac. Sci. Technol. A* 3(6), November/December 1985.

Since, according to the invention, it is known which advantages exist for coating in the plasma region as compared to coating in one of the dark regions, a further step according to the invention is taken in that the implementation of the plasma region is optimized in particular with respect to its spatial extent.

This is carried out by means of a magnetic field in the plasma region. It is thereby achieved that the plasma region extends homogeneously over a moderately large area of the reaction space by which the space available for disposing workpieces to be coated is enlarged.

Another object of the present invention is to provide an apparatus for the simultaneous plasma-enhanced chemical coating of opposite surface areas of a workpiece comprising means defining a vacuum process chamber; at least two spaced apart electrodes in the chamber which define a discharge space therebetween; means connected to at least one of the electrodes for generating a plasma discharge in the discharge space; insulated holding means in the chamber for holding the workpiece in the discharge space between the electrodes; and means for introducing a working gas into the chamber for producing a plasma-enhanced chemical coating on the opposite surface areas of the workpiece.

A further object of the present invention is to provide a method for the simultaneous coating of the opposite surface areas which includes using a metallo-organic compound for polymerization of the coating on the surface areas of the workpiece.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

The invention will now be explained by example in conjunction with the drawings wherein.

DESCRIPTION OF THE PREFERRED EMBODIMENTS

Figure 1:
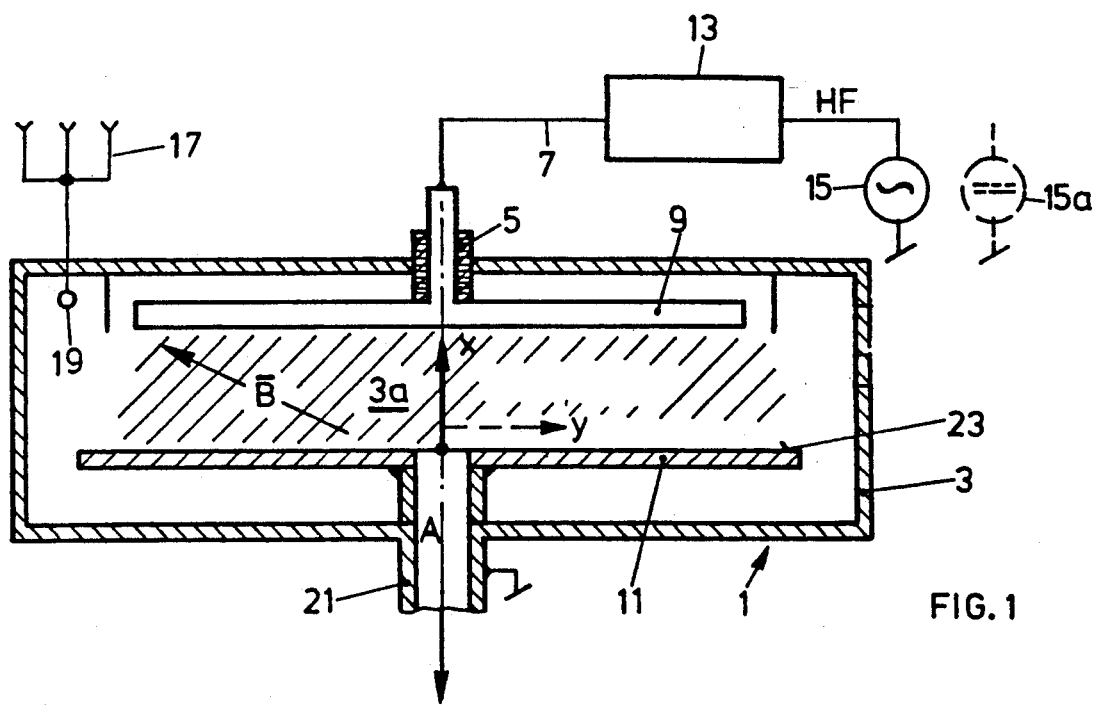
FIG. 1 a cross sectional view of a process chamber for carrying out a PECVD method and for illustrating the different coating rate relationships in connection with FIG. 2.

FIG. 1 schematically shows, in cross section, a known process chamber 1 for plasma-enhanced chemical vapor deposition (PECVD). It comprises a chamber housing 3 with an insulated feed-through 5 extending therethrough for supplying electrical energy over feed wire 7 to one of the electrodes 9, here shown as a plate electrode. A second electrode 11 is provided opposite the electrode 9 which, for example, is at ground potential along with the housing 3.

In particular for coating with an insulating coating material the feed wire 7 is connected via a matching network 13 to an ac generator 15 which, in the stated case, generates preferably a radio frequency signal. If appropriate from the point of view of the process, and especially in view of the coating material, instead of the ac signal generator 15 a dc voltage generator 15a, as shown in dashed lines, can be provided. In that case and if need be, the matching network 13 may be omitted.

For carrying out the PECVD process, gas inlets 17 are fed from one or several gas tanks and are provided in order to supply working gas or gas mixture containing the reaction gas in a controlled manner through inlet(s) 19 into the process chamber housing 3. The gas thus reaches a reaction space 3a lying between the electrodes and represented schematically. In the embodiment shown here, the process chamber has a cylindrical structure, and an evacuation port 21 which is coaxial to the cylinder axis A is provided and connected in known manner to a vacuum pump, and purification stages for effecting purification during the process. As stated, during the known operation of such a chamber for practicing a PECVD method between electrodes 9 and 11, the hatched plasma region is generated and is represented purely qualitatively. This region is distinguished by a high density of charge carriers in which the space charge density is at least approximately zero.

FIG. 1 illustrates an x-axis with an origin on the surface of the electrode 11. This axis is used with respect to FIG. 2.

Figure 2:
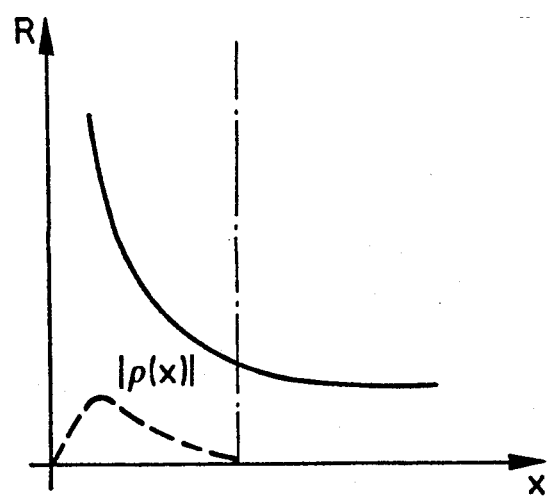
FIG. 2 is a graph showing the qualitative relationships of the coating rate R above a spatial axis x drawn by example in FIG. 1 perpendicular to the one electrode.

FIG. 2 represents the space charge density $\rho(x)$ as a function of the x-coordinate according to FIG. 1 which is shown in dashed line and purely qualitative. As was stated, it is in the vicinity of the electrode, that is the dark region, that the charge density is non-vanishing. The charge density vanishes in particular in the plasma region. But since in the plasma region the space charge density vanishes, the electric potential there is constant.

FIG. 2 further shows the coating rate R of the coating material deposited in a PECVD method and as a function of x. As is apparent the coating rate R in the dark region increases strongly with decreasing distance from the observed electrode so that considering only the coating rate as the optimization factor, the prior known approach, namely to position the workpiece to be coated in the dark region, readily presents itself. However in this dark region the coating rate gradient dR/dx is large so that in the event several electrically non-conducting areas are to be coated simultaneously, extreme care must be take that these areas are at the same x-coordinate value.

It is now apparent in FIG. 2 that the coating rate R in the plasma region does not vanish however the gradient dR/dx does. Consequently here the coating rate becomes largely independent of the x-coordinate, i.e. areas of a workpiece can be staggered in the x-direction in any given way and yet they are nevertheless coated identically.

If now the surface 23 on the electrode 11 according to FIG. 1 which is available for the conventional disposition of workpieces, is considered and compared with the plasma region available according to the invention for the disposition of workpieces it becomes apparent that with the findings on which the invention is based, i.e. utilization of the plasma region for PECVD coating, the space available for the disposition of areas to be coated simultaneously and identically is significantly greater, in particular if it is considered that workpieces, staggered in the x-direction, can therein now also be aligned laterally relative to one another since they even then do not cover one another with respect to coating.

Figure 3:
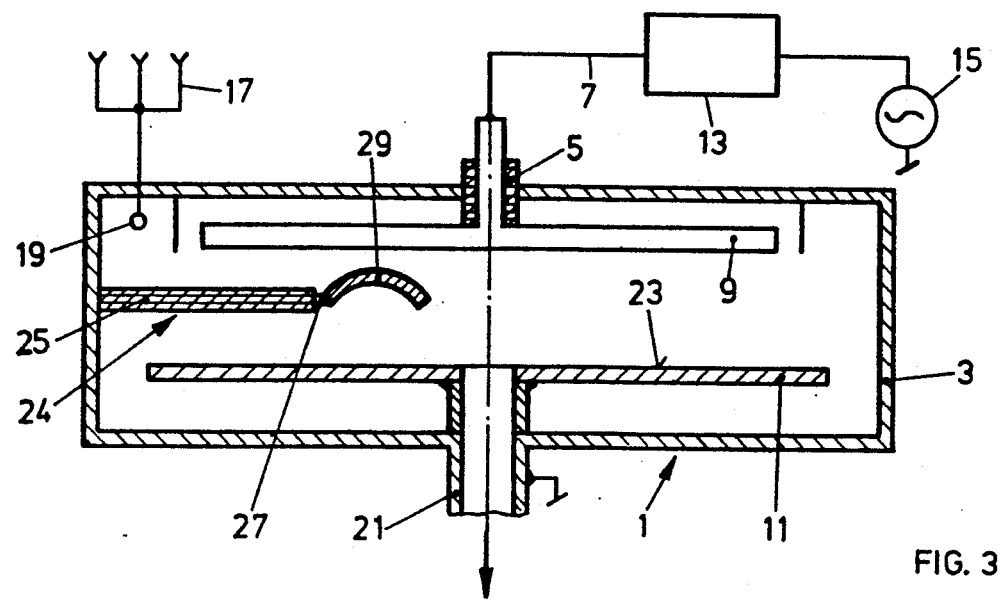
FIG. 3 is a view similar to FIG. 1 where the deposition of workpieces to be coated simultaneously on two and/or several sides is shown, according to the invention.

FIG. 3 builds on the representation in FIG. 1 and the explanations in connection with FIG. 2. FIG. 3 shows how, in a variant of the invention, the characteristic is utilized wherein the coating rate gradient vanishes in the discharge direction in the plasma region. Workpieces which are arched, concave, convex or otherwise curved, such as optic lenses, filter glasses etc. to be coated by the PECVD method are positioned with a holding device 24 in the plasma region and specifically electrically insulated with respect to the apparatus parts to which a potential is applied. These parts include the electrode 9, the chamber housing 3, and the counter electrode 11.

To this end an insulation section 25 is provided on the holding device 24. A holding member 27, implemented in any given way and depending on the workpiece is provided at the end of section 25 in order to position a workpiece 29 to be coated, in an area of the plasma region. The workpiece which is at a free floating potential, can be coated on two sides or on all sides and at the at least two areas can be coated simultaneously and identically. In FIG. 3 the disposition of only one workpiece 29 is represented. It is understood however that for example by having holding devices 24 projecting radially into the chamber, a large number of workpieces 29 can be positioned for simultaneous two-sided coating during one process.

Figure 4:
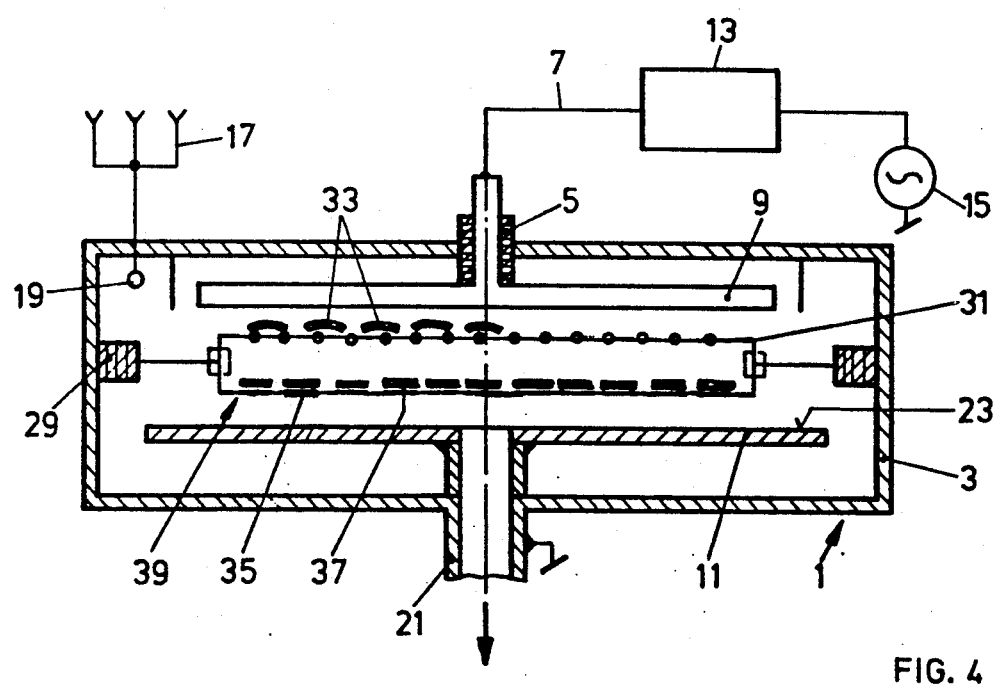
FIG. 4 is a view similar to FIG. 1 where a deposition of workpieces for simultaneous uniform coating according to the invention is shown.

FIG. 4 shows how, in principle, a multiplicity of workpieces to be coated simultaneously and identically are provided. As described and with respect to apparatus parts at a potential, a holding member 30 is provided for example with a grid structure 31 whereon workpieces 33 are disposed to be coated on all sides and in particular on two sides simultaneously. In addition, arched, curved or otherwise formed workpieces can be coated such as lenses.

A number of planar workpieces 37 can also be placed on a lower net-like or grid-like structure 35 for example. The net-like structure is formed so that the one surface of the in this case planar workpiece 37, rests on the structure and consequently is not coated. Potentially the two net structures are fabricated of an insulating material such as schematically represented at 39 or at least insulated against each other in order not to disturb the potential distribution in the plasma region by galvanic equalizing currents.

If uniform simultaneous coating is to be ensured over a moderately large area not only in the x-direction but also in the lateral direction (indicated in dashed line y in FIG. 1) it may be necessary to influence the distribution of the plasma such as to homogenize and expand it in order to obtain the maximum utilizable space according to the invention. This is achieved in principle and as shown schematically in FIG. 1 by applying a magnetic induction field $\overline{B}$. Such a field $\overline{B}$ is generated by providing a permanent and/or electromagnet arrangement preferably outside the chamber.

Figure 5:
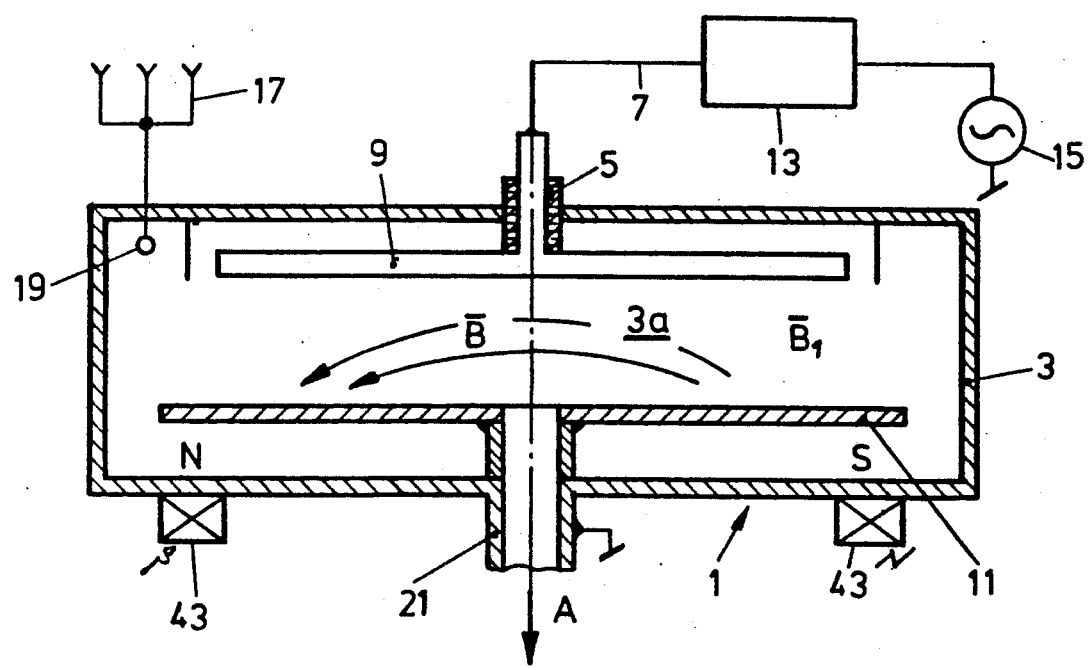
FIG. 5 is a view similar to FIG. 1 where the plasma distribution is influenced by magnets for generating a magnetic induction field $\overline{B}$.

As shown in FIG. 5, permanent magnets 43 are provided in the area of the electrode 11 outside of chamber 3 and are distributed symmetrically with respect to axis A.

EXAMPLE

In a capacitively coupled RF reactor of the type shown in the Figures with a plate distance between the electrodes 9 and 11 of 7 cm, a glass plate with dimensions $50 \times 50 \times 2$ mm was positioned for example above the vacuum suction or evacuation port 21, and substantially centrally between the electrodes. Coating was done by plasma polymerization of dimethyldiethoxylsilane at a gas flow of 31 sccm (standard cubic centimeter per minute; standard $cm^3$ at 0° C. and 760 mm Hg), 600 Watts RF power, a pressure of 7 mTorr for a period of 30 minutes. Both sides of the glass plate were subsequently coated with a coating of 550 nm thickness.

In the same reactor a synthetic lens with a diameter of 65 mm and a curvature 1/R' of 0.013 cm was positioned eccentrically i.e. laterally in the y-direction at approximately one half the radius of the electrode 9, 11. Permanent magnets such as represented in FIG. 5 were provided so that on the substrate i.e. in the region of the synthetic lens a magnetic field of 10 to 100 Gauss originated. At a pressure of 7 mTorr, a gas flow of 31 sccm, 600 Watts RF power at again 13.56 MHz, both sides were coated at a deposition rate of 38 nm/minute. A curvature caused thickness difference of the coating from the central region of the lens toward its periphery could not be detected.

In an identical reactor with a plate distance of 5 cm further a cube of polycarbonate having a side length $1 \times 1 \times 1$ cm was positioned coaxially and again coated by plasma polymerization of dimethyldiethoxylsilane at a gas flow of 30 sccm and a pressure of 0.15 mbar and 1000 Watts RF power (13.56 MHz) for a period of 45 minutes. The cube had a coating on all sides of 700 nm.

Although by no means to be interpreted as limiting the approach according to the invention, the man skilled in the art is advised to carry out the process according to the invention initially with the tested pressure values of 1 mTorr to 1 Torr.

Where a plurality of workpieces are provided in the treatment chamber, there may be staggered in the direction of discharge between the electrodes. As part of the PECVD method, a metallo-organic gaseous compound is supplied to the treatment chamber which results by a polymerization at the surfaces of the workpiece, in producing a mechanically and chemically resistent coating. Synthetic substrates may also be coated by the present invention, which are optically transparent and abrasion-proof.

While specific embodiments of the invention have been shown and described in detail to illustrate the application of the principles of the invention, it will be understood that the invention may be embodied otherwise without departing from such principles.

What is claimed is:

1. A method for simultaneous and substantially identical plasma-enhanced chemical coating of opposite surfaces of at least one workpiece, the method comprising:

applying an electrical potential difference between a pair of spaced apart electrodes for generating a plasma discharge therebetween, a region of constant electrical potential being established between the electrodes;

positioning the workpiece between said two electrodes and in the region of constant electrical potential with said opposite surfaces substantially equally spaced from respective ones of said two electrodes and respectively facing and being fully exposed to respective ones of said electrodes; and causing the workpiece to be at a free floating electrical potential with respect to the said two electrodes to allow said discharge between said two electrodes to develop around said workpiece between said two electrodes to form substantially identical plasma-enhanced chemical coatings on said opposite surfaces.

2. A method according to claim 1 including placing said electrodes and said workpiece in a vacuum treatment chamber and supporting the workpiece in the chamber using a side-mounted workpiece holder which is mechanically connected to the chamber and electrically insulated from the chamber, for causing the workpiece to be at a free floating electrical potential.

3. A method according to claim 2, wherein each of said opposite surfaces of the workpiece are arched.

4. A method according to claim 2, including supplying a metallo-organic gaseous compound to the chamber for polymerization on said opposite surfaces of the workpiece to produce coatings which are resistant to mechanical and chemical influences.

5. A method according to claim 2, including supplying a gaseous chemical to the chamber which forms an optically transparent abrasion-resistant coating on said opposite surfaces of the workpiece.

6. A method according to claim 2, including applying a capacitively coupled AC voltage of RF frequency between said two electrodes for generating the plasma discharge, one of the electrodes being at ground potential.

7. A method according to claim 1, wherein one of said opposite surfaces is cured concavely and the other of said opposite surfaces is cured convexly.

8. A method according to claim 1, including positioning a plurality of workpieces each with opposite surfaces, in staggered positions between said two electrodes in the region of constant potential, and causing all of said workpieces to be at a freely floating electrical potential to form substantially identical plasma-enhanced chemical coatings on opposite surfaces of all of said workpieces.

9. A method according to claim 1, including generating a magnetic field between said electrodes.

10. A method according to claim 1, wherein at least one of said opposite surfaces is planar.

11. A method according to claim 1, wherein at least one of said opposite surfaces is arched.

* * * * *